(12) United States Patent
Feng et al.

(10) Patent No.: US 7,749,564 B2
(45) Date of Patent: Jul. 6, 2010

(54) METHOD AND APPARATUS FOR THE PRODUCTION OF THIN FILM COATINGS

(75) Inventors: Bao Feng, Dunlap, IL (US); Mahmoud Taher, Pooria, IL (US); Andrew G. Shull, Washington, IL (US); Eric P. Carlson, Christiansburg, VA (US); Conrad C. Klepper, Radford, VA (US)

(73) Assignee: Caterpillar Inc., Peoria, IL (US)

( * ) Notice: Subject to any disclaimer, the term of this patent is extended or adjusted under 35 U.S.C. 154(b) by 1107 days.

(21) Appl. No.: 11/396,116

(22) Filed: Mar. 31, 2006

(65) Prior Publication Data

US 2006/0222772 A1 Oct. 5, 2006

Related U.S. Application Data

(60) Provisional application No. 60/666,579, filed on Mar. 31, 2005.

(51) Int. Cl.
*C23C 16/26* (2006.01)
(52) U.S. Cl. ................ 427/249.7; 427/569
(58) Field of Classification Search ........... 427/249.7
See application file for complete search history.

(56) References Cited

U.S. PATENT DOCUMENTS

| | | | |
|---|---|---|---|
| 4,166,783 A | 9/1979 | Turner | |
| 4,336,119 A | 6/1982 | Gillery | |
| 4,379,040 A | 4/1983 | Gillery | |
| 4,379,743 A | 4/1983 | Nakatsukasa et al. | |
| 4,400,255 A | 8/1983 | Kisner | |
| 4,428,811 A | 1/1984 | Sproul | |
| 4,428,812 A | 1/1984 | Sproul | |
| 4,626,477 A | 12/1986 | Jackson et al. | |
| 4,704,199 A | 11/1987 | Yokokawa et al. | |
| 4,884,820 A | 12/1989 | Jackson et al. | |
| 5,080,730 A | 1/1992 | Wittkower | |
| 5,156,727 A | 10/1992 | Bjornard et al. | |
| 5,314,540 A | 5/1994 | Nakamura et al. | |
| 5,358,596 A | 10/1994 | Cappelli et al. | |
| 5,376,777 A | 12/1994 | Kamei et al. | |
| 5,405,645 A | 4/1995 | Sevillano et al. | |
| 5,466,431 A * | 11/1995 | Dorfman et al. | ........... 423/446 |
| 5,570,175 A | 10/1996 | Dobele et al. | |
| 5,584,974 A | 12/1996 | Sellers | |

(Continued)

OTHER PUBLICATIONS

Bull, "Tribology of carbon coatings: DLC, diamond and beyond," Diamond and Related Materials, 4:827-836 1995.

(Continued)

*Primary Examiner*—Roberts Culbert
(74) *Attorney, Agent, or Firm*—Finnegan, Henderson, Farabow, Garrett & Dunner (57) ABSTRACT

The present disclosure provides a method for producing a coating. The method may include providing a substrate material and initiating a coating-deposition process to apply a coating material to the substrate material to produce a coating on the substrate material, wherein the coating includes a diamond-like carbon coating. The method may further include monitoring an intensity of hydrogen-alpha emission of a plasma produced during the coating-deposition process and adjusting at least one process variable of the coating-deposition process to facilitate production of the diamond-like carbon coating.

20 Claims, 7 Drawing Sheets

U.S. PATENT DOCUMENTS

| | | | |
|---|---|---|---|
| 5,772,760 | A | 6/1998 | Gruen et al. |
| 5,849,079 | A | 12/1998 | Gruen et al. |
| 5,885,541 | A | 3/1999 | Bates |
| 5,942,089 | A | 8/1999 | Sproul et al. |
| 5,989,511 | A | 11/1999 | Gruen et al. |
| 6,106,676 | A | 8/2000 | Terry et al. |
| H1924 | H * | 12/2000 | Zabinski et al. ........ 204/192.16 |
| 6,444,105 | B1 | 9/2002 | Lai et al. |
| 6,454,919 | B1 | 9/2002 | Sundarrajan et al. |
| 6,458,415 | B2 | 10/2002 | Meguro et al. |
| 6,489,589 | B1 | 12/2002 | Alexander |
| 6,500,321 | B1 | 12/2002 | Ashtiani et al. |
| 6,524,455 | B1 | 2/2003 | Sellers |
| 6,700,329 | B2 | 3/2004 | Giapis et al. |
| 6,837,935 | B2 | 1/2005 | Meguro et al. |
| 2002/0005170 | A1 | 1/2002 | Meguro et al. |
| 2002/0171367 | A1 | 11/2002 | Giapis et al. |
| 2003/0000467 | A1 | 1/2003 | Meguro et al. |
| 2003/0129117 | A1 | 7/2003 | Mills |
| 2004/0247522 | A1 | 12/2004 | Mills |

OTHER PUBLICATIONS

Cao et al., "Friction and wear characteristics of ceramic nanocomposite coatings: Titanium carbide/amorphous hydrocarbon," Applied Physics Letters, 79:329-331 2001.

Colchin et al., "The Filterscope," Review of Scientific Instruments, 74:2068-2070 2003.

Dijurovic et al., "Hydrogen Balmer alpha line shapes for hydrogen-argon mixtures in a low-pressure rf discharge," J. Appl. Phys., 74:6558-6565 1993.

Feng et al., "Probing for mechanical and tribological anomalies in the TiC/amorphous hydrocarbon nanocomposite coating system," Thin Solid Films, 398-399:210-216 2001.

Gahlin et al., "ME-C:H coatings in motor vehicles," Wear, 249:302-309 2001.

Grill, "Review of the tribology of diamond-like carbon," Wear, 168:143-153 1993.

Klepper et al., "Ha Emission as a feedback control sensor for reactive sputter deposition of nano-structured, diamon-like carbon coatings," IEEE Transactions on Plasma Science, 33:799-807 2005.

Meng, "Ti atomic bonding environment in Ti-containing hydrocarbon coatings," Journal of Applied Physics, 88:2415-2422 2000.

Olofsson et al., "Increased wear resistance of roller bearings using Me-C: H coated rollers," Journal of Tribology, 122:682-688 2000.

Rossnagel et al., "Langmuir probe characterization of magnetron operation," J. Vac. Sci. Technol. A, 4:1822-1825 1986.

Shi et al., "Intrinsic stress development in Ti-C:H ceramic nanocomposite coatings," Applied Physics Letters, 81:352-354 2002.

Shi et al., "Intrinsic stresses and mechanical properties of Ti-containing hydrocarbon coating," Journal of Applied Physics, 94:186-194 2003.

Shon et al., "Velocity distributions in magnetron sputter," ISEE Transactions on Plasma Science, 26:1635-1644 1998.

* cited by examiner

METHOD AND APPARATUS FOR THE PRODUCTION OF THIN FILM COATINGS

This application claims priority to U.S. Provisional Application 60/666,579, filed on Mar. 31, 2005, which is herein incorporated by reference.

U.S. GOVERNMENT RIGHTS

This invention was made with government support under the terms of NIST ATP 70NANBH0H3048 awarded by the Department of Commerce. The government may have certain rights in this invention.

TECHNICAL FIELD

This disclosure pertains generally to the production of thin film coatings, and more particularly, to the production of diamond-like carbon thin film coatings.

BACKGROUND

Diamond-like carbon (DLC) coatings are used in many different fields. These coatings may be applied to many different substrates and may provide desired mechanical, electrical, optical, magnetic, chemical, biologic, and/or aesthetic properties. For example, the durability and performance of many machine parts can be enhanced by DLC thin film coatings by providing desired mechanical properties including, for example, wear resistance, controlled friction coefficients, strength, and/or fracture toughness.

Metal-containing amorphous carbon (Me-aC) and metal-containing amorphous hydrocarbon (Me-aC:H) coatings are two similar DLC coatings. These coatings are characterized by nanocrystalline metal-carbide clusters embedded in an amorphous carbon (aC) or an amorphous hydrocarbon (aC:H) matrix. Because these coatings may provide desirable tribologic properties and may have good adhesion properties when applied to many substrates, they are often used to protect machine parts.

Me-aC and Me-aC:H coatings may be produced using a number of commercially available processes, including a number of different vapor deposition processes. The processes used to produce these coatings may be controlled by computerized recipe managers, which may adjust deposition system variables to attain a certain level of coating reproducibility. However, for some applications, improved control of coating production to attain even better reproducibility may be needed. Particularly, for some applications it may be desirable to closely control deposition conditions to provide a desired coating composition and structure.

One method for producing a thin film coating is described in U.S. Pat. No. 5,405,645, issued to Sevillano on Apr. 11, 1995 (hereinafter "the '645 patent"). The method of the '645 patent includes adjusting gas flow rates within a microwave plasma generator to maintain a ratio of Carbon-2 ($C_2$) and hydrogen-alpha ($H_\alpha$) emission intensities within a certain range. Control of the ratio of $C_2$ to $H_\alpha$ emission, according to the method of the '645 patent, may increase the rate of film deposition.

Although the method of the '645 patent may produce a suitable thin film coating, the method has several drawbacks. The method of the '645 patent is intended for high-quality diamond film production, which may not be desirable for some applications. Further, production of high-quality diamond films may require processing conditions which may alter or damage some substrate materials. In addition, the method of the '645 patent does not provide a method for producing Me-aC or Me-aC:H coatings with reproducible microstructural and physical properties.

The present disclosure is directed to overcoming one or more of the problems or disadvantages in the prior art thin film coating production systems.

SUMMARY OF THE INVENTION

One aspect of the present disclosure includes a method for producing a coating. The method may include providing a substrate material and initiating a coating-deposition process to apply a coating material to the substrate material to produce a coating on the substrate material, wherein the coating includes a DLC coating. The method may further include monitoring an intensity of $H_\alpha$ emission of a plasma produced during the coating-deposition process and adjusting at least one process variable of the coating-deposition process to facilitate production of the DLC coating.

A second aspect of the present disclosure includes a deposition system for producing a coating on a substrate material. The system may include a deposition chamber and at least one sensor configured to monitor an intensity of $H_\alpha$ emission produced within the deposition chamber. The system may further include a control system configured to monitor one or more deposition system variables and to adjust at least one system variable to maintain the intensity of $H_\alpha$ emission within a predetermined range to facilitate production of a DLC coating on the substrate.

A third aspect of the present disclosure includes a method for producing a coating. The method may include providing a substrate material and initiating a coating-deposition process to apply a coating material to the substrate material to produce a coating on the substrate material, wherein the coating includes a DLC coating. The method may further include monitoring an intensity of $H_\beta$ emission of a plasma produced during the coating-deposition process and adjusting at least one process variable of the coating-deposition process to facilitate production of the DLC coating.

DETAILED DESCRIPTION

Figure 1:
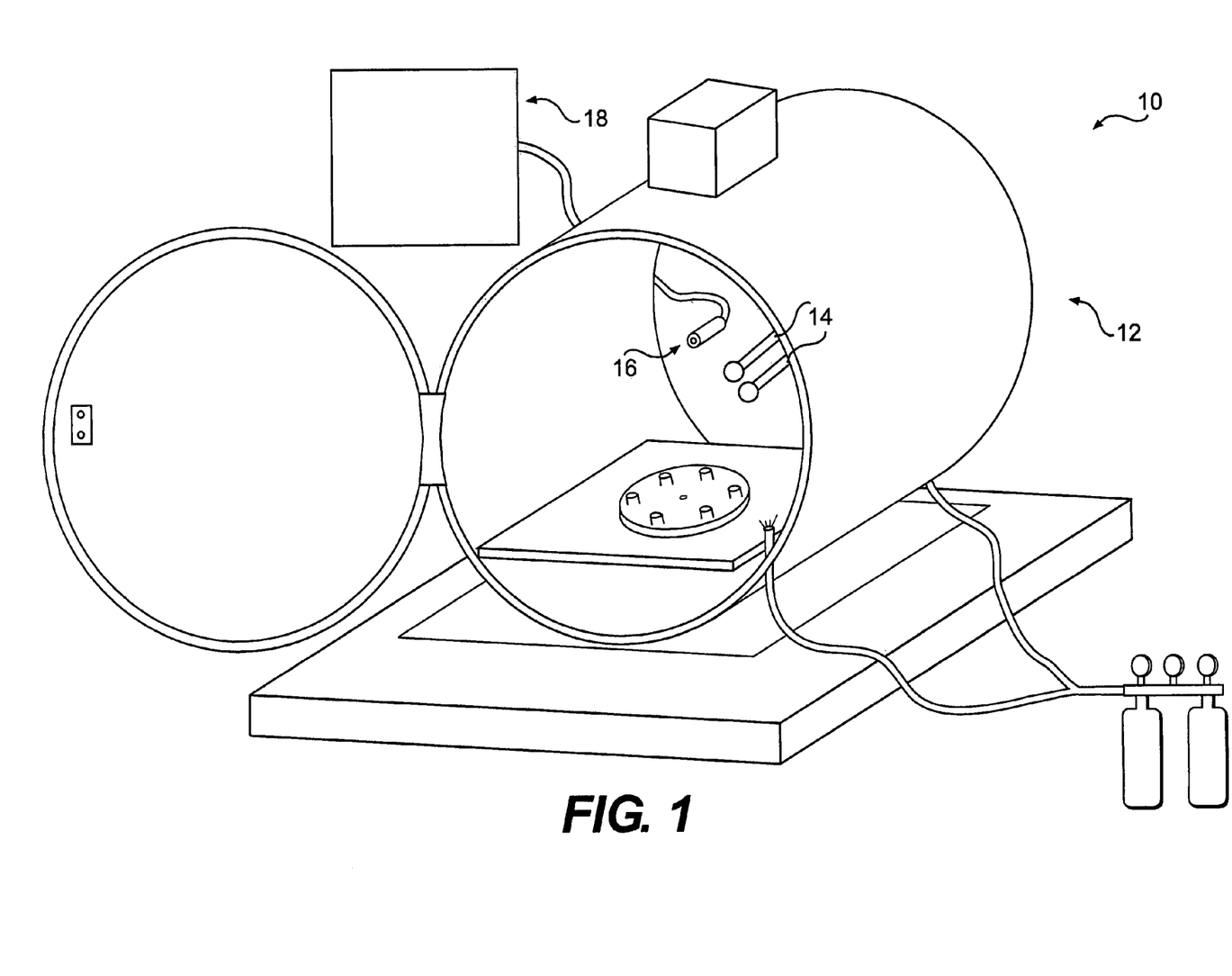
FIG. 1 illustrates a coating deposition system, according to an exemplary disclosed embodiment.

FIG. 1 illustrates a coating deposition system 10, according to an exemplary embodiment. The system may include a deposition chamber 12, which may include one or more sensors 14, including at least one monochromator 16. Monochromator 16 may be configured to detect optical radiation, including wavelengths corresponding to the visible range, spectral line emissions from the Balmer series of the hydrogen atom, such as the Balmer-alpha line at about 656 nm ($H_\alpha$) and/or the Balmer-beta line at 486 nm ($H\beta$). Monochromator 16 may communicate with a coating production control system 18, which may facilitate monitoring and adjustment of a coating production process performed in deposition chamber 12.

Deposition chamber 12 may be configured to produce a number of different coating types. In one embodiment, deposition chamber 12 may be configured to produce a DLC coating on one or more substrate materials. Further, the DLC coating may include many suitable DLC coating types. For example, the coating may include a number of suitable compositions, structures, physical properties, thermal properties, chemical properties, and/or electrical properties. The specific coating composition, structure, and/or properties may be selected based on a variety of factors including, for example, desired applications, production costs, and/or production time.

In one embodiment, deposition chamber 12 may be configured to produce a Me-aC coating and/or a Me-aC:H coating. The coating may further include one or more nanocrystalline components including, for example, metal-nitrides and/or metal-carbides. Further, the specific amount of metal, carbon, nitride, and/or carbide may be selected based on desired coating properties including, for example, hardness, wear resistance, friction coefficients, fracture toughness, bonding or adhesion to substrates, and/or aesthetic properties. Any suitable coating may be produced based on desired applications.

Me-aC and Me-aC:H coatings may include a number of suitable metal components. For example, suitable metal components may include a number of transition metals, including Group 4B and/or Group 6B transition metals. Such metals may include, for example, titanium, tungsten, zirconium, hafnium, niobium, chromium, and/or nickel. The specific metal or combination of metals may be selected based on a number of factors including, for example, cost, availability, desired application, and/or bonding of the coating with suitable substrates. Any suitable metal may be selected to produce a Me-aC or Me-aC:H coating.

The coating may include a single layer or may include multiple layers. In one embodiment, each coating layer may be characterized by a certain composition and/or structure. The composition of each layer may include a certain percentage of metal, metal-nitrides, and/or metal-carbides. Further, the coating production process may be selected to produce a predefined coating composition and structure in each layer. In addition, each layer may be structurally distinct, having a well-defined boundary between one or more layers. Alternatively, a transition zone may be formed between one or more layers, wherein the transition zone is represented by a composition gradient and/or a structural gradient between one or more layers.

Suitable coatings may be produced on a number of different substrates. The specific substrate material may be selected based on a desired application and needed physical properties. For example, in one embodiment, a substrate may be selected to have a certain strength or resistance to deformation. In other embodiments, the substrate may be selected based on certain chemical, electrical, and/or magnetic properties. Further, the substrate may be selected to facilitate bonding and/or adhesion of the coating to the substrate.

The substrate may include a variety of different metal, composite, ceramic, and/or polymeric materials. For example, the coating may be produced on any type of steel including, for example, any tool steel or stainless steel. The coating may also be produced on ceramics, polymers, semiconductors (e.g. single or polycrystalline silicon), glasses, etc. Any suitable substrate material may be selected.

The coating may also have a range of suitable thicknesses and/or contours. For example, the coating may have a thickness between about 0.5 microns and 20 microns. Typically, the coating will have a thickness less than about 10 microns, but any coating thickness may be selected based on production costs, production time, coating types, and/or desired application. Further, the coating may be produced on flat substrates. Alternatively, the coating may be produced on substrates having more complex surface geometries including, for example, machine parts having curved, rounded, angled, and/or textured surfaces. For example, suitable machine parts may include gears, bearings, cams, shafts, fuel system components, and/or any other machine part. Further, the coating may be produced as a decorative coating on any part including, for example, faucets, door knobs, jewelry, light-fixtures, and belt buckles.

Deposition chamber 12 may be configured to produce a coating using a number of suitable coating production processes. For example, deposition chamber 12 may be configured to apply a coating by a number of different vapor deposition processes, including physical vapor deposition (PVD) processes and/or chemical vapor deposition (CVD) processes. Suitable PVD and CVD processes may include, for example, sputtering, arc-vapor deposition, ion-plating, and plasma-assisted chemical vapor deposition. Further, hybrid deposition processes, which may include two deposition techniques performed simultaneously or sequentially, may be used. Any suitable production process may be used to produce suitable DLC coatings.

Figure 2:
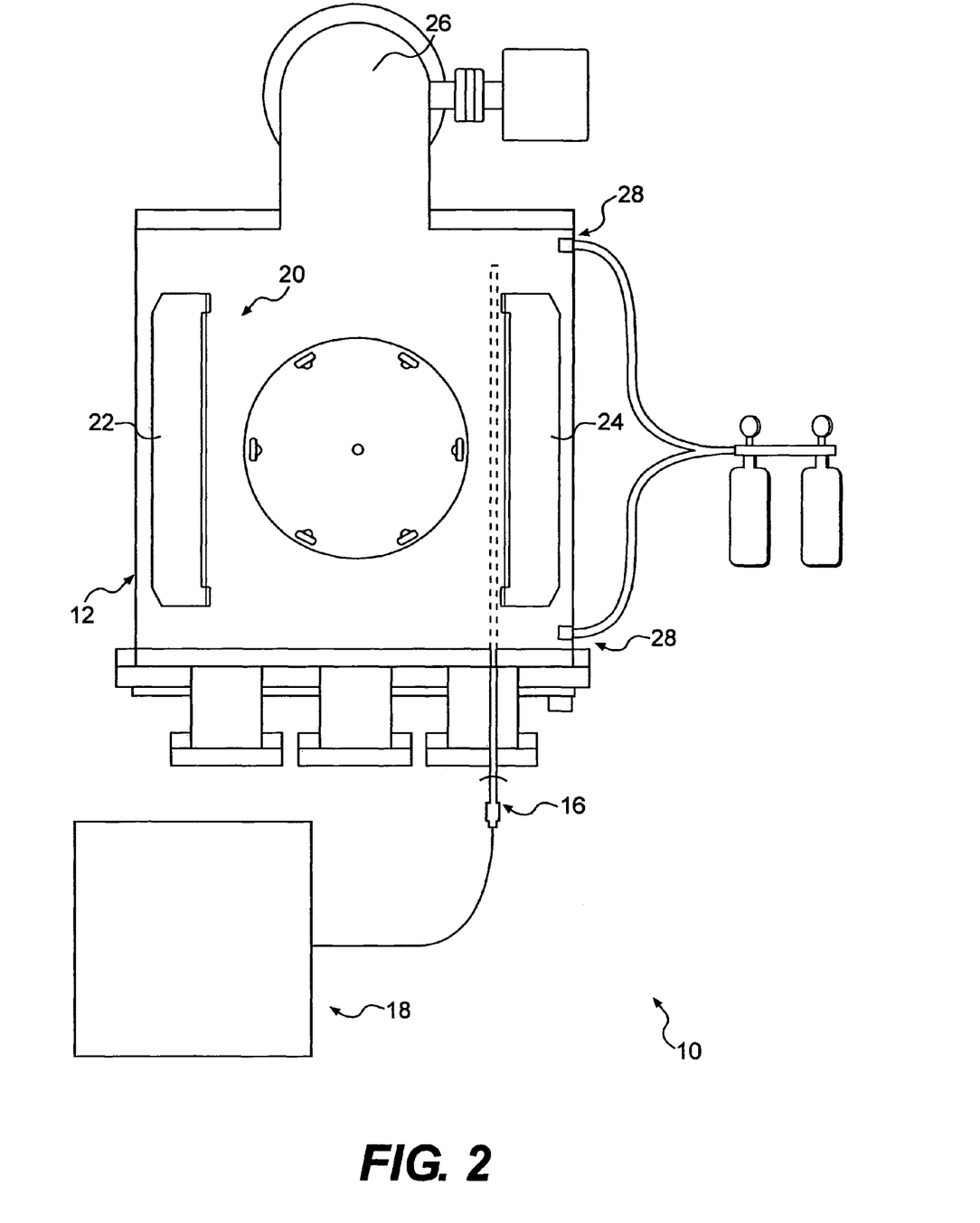
FIG. 2 provides a top view of a coating deposition system, according to an exemplary disclosed embodiment.

FIG. 2 provides a top view of one embodiment of deposition chamber 12. In this embodiment, deposition chamber 12 includes a magnetron sputtering system 20. However, deposition chamber 12 may also include any type of vacuum deposition system, including any PVD or CVD system that may be used to produce a suitable DLC coating.

As shown in FIG. 2, magnetron sputtering system 20 may include one or more cathodes 22, 24 on which metal targets may be mounted. The metal targets may provide source materials for the metal component of a Me-aC or Me-aC:H coating, and cathodes 22, 24 may provide a cathode voltage and create a magnetic field to confine a plasma within a certain region of deposition chamber 12. The temperature of cathodes 22, 24 may be controlled using a number of suitable cooling systems including, for example, a water cooling system. As shown, magnetron sputtering system 20 includes two opposing cathodes 22, 24, but any suitable number and configuration of cathodes 22, 24 may be used. For example, magnetron sputtering system may include between one and ten cathodes 22, 24.

Deposition chamber 12 may further include a variety of environmental control systems. Such environmental control systems may include one or more vacuum systems 26, which may be configured to maintain a certain gas pressure within deposition chamber 12. Deposition chamber 12 may also include temperature control systems, including heaters and coolers. The temperature control systems may be configured to control the temperature of certain system components, substrates, and/or the gas contained within deposition chamber 12.

Operation of magnetron sputtering system 20 may be performed in the presence of one or more gases within deposition chamber 12. In one embodiment, the one or more gases may include one or more substantially inert gases including, for example, argon. Further, the one or more gases may include one or more reactive gases including, but not limited to, nitrogen ($N_2$), acetylene ($C_2H_2$), methane ($CH_4$), a fullerene, and/or benzene ($C_6H_6$). Any suitable reactive gas may be used to produce a coating having a desired composition and/or structure.

The composition and pressure of the gas within deposition chamber 12 may be selected to facilitate production of DLC coatings, including Me-aC:H or Me-aC coatings. Further, the gas composition and pressure may be controlled in conjunction with other processing parameters to produce a coating having a certain composition and/or structure. In one embodiment, it may be desirable to produce a coating having a certain amount of metal-carbide and/or metal-nitride. For example, the flow rate of acetylene may be controlled to produce a certain amount of metal-carbide within the coating, and the flow rate of nitrogen may be controlled to produce a certain amount of metal-nitride within the coating. In one embodiment, the amount of metal-carbide and/or metal-nitride may be uniform across the depth of the desired coating. Alternatively, the amount of metal-carbide and/or metal-nitride may be varied within or between one or more layers of the desired coating.

The composition and pressure of the one or more gases within deposition chamber 12 may be controlled by a number of suitable instruments. For example, vacuum system 26 may facilitate control of the total gas pressure within deposition chamber 12. Deposition chamber 12 may also include one or more gas supply devices 28, which may be configured to control the flow of reactive or inert gases into deposition chamber 12. Any suitable vacuum system 26 and gas supply device 28 may be used.

Deposition chamber 12 may include one or more sensors 14, which may be configured to monitor a variety of different conditions within deposition chamber 12. For example, in one embodiment, sensors 14 may include a variety of gas sensors, chemical analyzers, temperature sensors, pressure sensors, Langmuir probes, spectrometers and/or any other instruments that may facilitate monitoring and/or control of a coating production process.

As noted above, deposition chamber 12 may include monochromator 16, which may be configured to measure the intensity of optical radiation. Monochromator 16 may be able to scan through a range of wavelengths and may be configured to measure the intensity of a single wavelength. In one embodiment, monochromator 16 may be configured to measure the intensity of optical radiation corresponding to a wavelength of $H_\alpha$ emission within deposition chamber 12. Particularly, for $H_\alpha$ emission monitoring, monochromator 16 may be configured to measure optical radiation having a wavelength of 656 nm. In another embodiment, monochromator 16 may be configured to measure the intensity of optical radiation corresponding to a wavelength of $H_\beta$ emission within deposition chamber 12. Particularly, for $H_\beta$ emission monitoring, monochromator 16 may be configured to measure optical radiation having a wavelength of 486 nm. Further, monochromator 16 may be configured to communicate a signal indicative of the intensity of $H_\alpha$ emission and/or $H_\beta$ emission within deposition chamber 12 to a coating production control system 18.

Balmer series of hydrogen emissions may be produced by a plasma contained within deposition chamber 12, and the intensity of plasma Balmer series emissions, as measured by monochromator 16, may be correlated with the composition and/or structure of a coating produced within deposition chamber 12. For example, in the case of Me-aC and Me-aC:H coatings, $H_\alpha$ and/or $H_\beta$ emission may be correlated with the formation of one or more components, including metal-carbides and/or metal-nitrides. Additionally, $H_\alpha$ and/or $H_\beta$ emission may be correlated with other DLC coating features, including an amount of amorphous carbon present in the DLC matrix and/or a degree of coating hydrogenation. Further, the composition and/or structure of a DLC coating produced within deposition chamber 12 may be monitored and controlled using $H_\alpha$ and/or $H_\beta$ emission intensity measurements and coating production control system 18.

Figure 3:
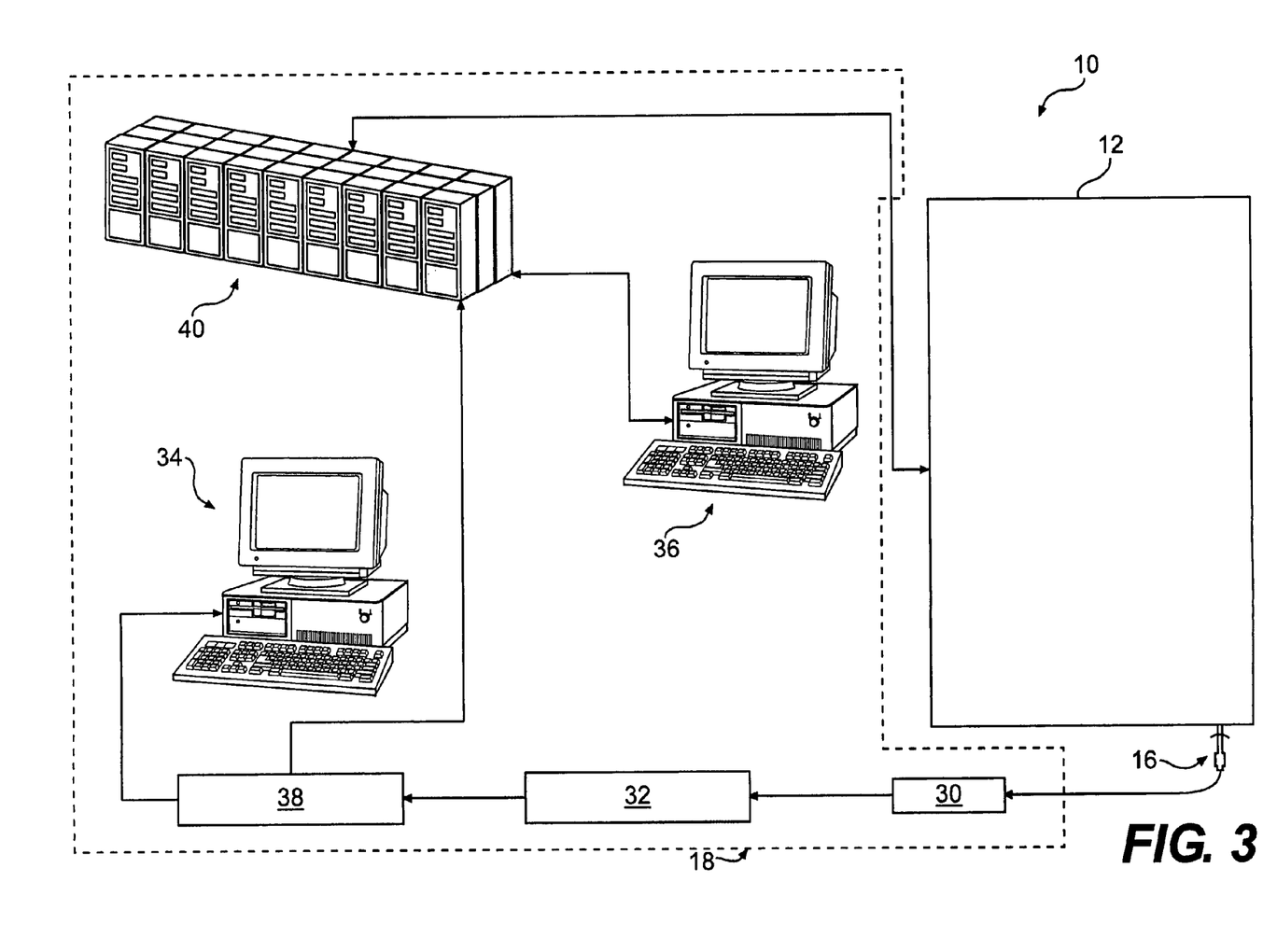
FIG. 3 illustrates a coating production control system, according to an exemplary disclosed embodiment.

FIG. 3 illustrates coating production control system 18, according to an exemplary embodiment. Coating production control system 18 may include one or more signal amplifiers 30 and one or more signal filters 32, which may be configured to receive and filter a signal from monochromator 16. Coating production control system 18 may further include one or more control computers 34, 36 and one or more programmable logic controllers (PLCs) 40 to analyze and respond to data pertaining to coating production processes. In one embodiment, coating production control system 18 may provide closed-loop feedback control of a coating production process based on an output from monochromator 16.

Monochromator 16 may communicate with one or more components of control system 18 to supply a signal indicative of measurements made by monochromator 16. The signal may include a variety of different signal types including, for example, electrical or optical data. The signal may include light of one or more wavelengths, which may be further filtered and analyzed by control system 18. Alternatively, monochromator 16 may be configured to filter and/or process a signal before passing the signal to control system 18.

In one embodiment, monochromator 16 may communicate with one or more signal amplifiers 30. Any suitable signal amplifier may be used to amplify a signal produced by monochromator 16. In one embodiment, signal amplifier 30 may include a photo-multiplier tube (PMT), which may be coupled with monochromator 16 using a suitable optical link including, for example, a fiber-optic cable. The PMT may amplify an optical signal from monochromator 16 to produce a stronger optical signal, which may be further filtered and/or analyzed. Any suitable signal amplifier 30 may be used.

A variety of suitable filters 32 may be included in production control system 18. Such filters 32 may include, for example, a band-pass filter. In one embodiment filter 32 may include an optical filter configured to filter an amplified optical signal produced by a PMT. Further, in one embodiment, filter 32 may include an $H_\alpha$ bandpass filter and/or an $H_\beta$ bandpass filter, which may be configured to filter substantially all wavelengths that do not correspond to $H_\alpha$ or $H_\beta$ emission. Any suitable filter or combination of filters may be provided. Production control system 18 may further include one or more computer communication interfaces 38. Communication interfaces 38 may be configured to convert a signal from another source, such as one or more filters 32, into a format that may be useable by computers 34, 36 and/or PLC 40. For example, communication interfaces 38 may include additional filters 32, analog-to-digital converts, and/or any other suitable component needed to process and/or digitize a signal for use by computers 34, 36 and/or PLC 40.

Computers 34, 36 may be configured to receive digitized data from communication interfaces 38. Computers 34, 36 may store data for later use or analysis. Computers 34, 36 may also perform simple or complex calculations needed to facilitate monitoring and/or control of a coating production process. Further, computers 34, 36 may be configured to control one or more components of deposition system 10, including components of deposition chamber 12 and control system 18.

Computers 34, 36 may interface with one or more PLCs 40, which may facilitate control of one or more coating production variables. For example, PLC 40 may be configured to control an aspect of a coating production process by adjusting the operation of one or more components of deposition chamber 12 including, for example, gas supply devices 28, vacuum system 26, temperature control systems, and/or magnetron sputtering system 20. PLC 40 may be configured to control any coating production process variable for any suitable production process.

PLC 40 may be configured to receive one or more signals indicative of a coating production process variable. These signals may include data indicative of $H_\alpha$ emission intensity, $H_\beta$ emission intensity, chamber pressure, temperature, gas flow, gas concentration, and/or any other environmental condition within deposition chamber 12. Further, PLC 40 may be configured to effect changes in a coating production process based on the one or more variables.

Figure 4:
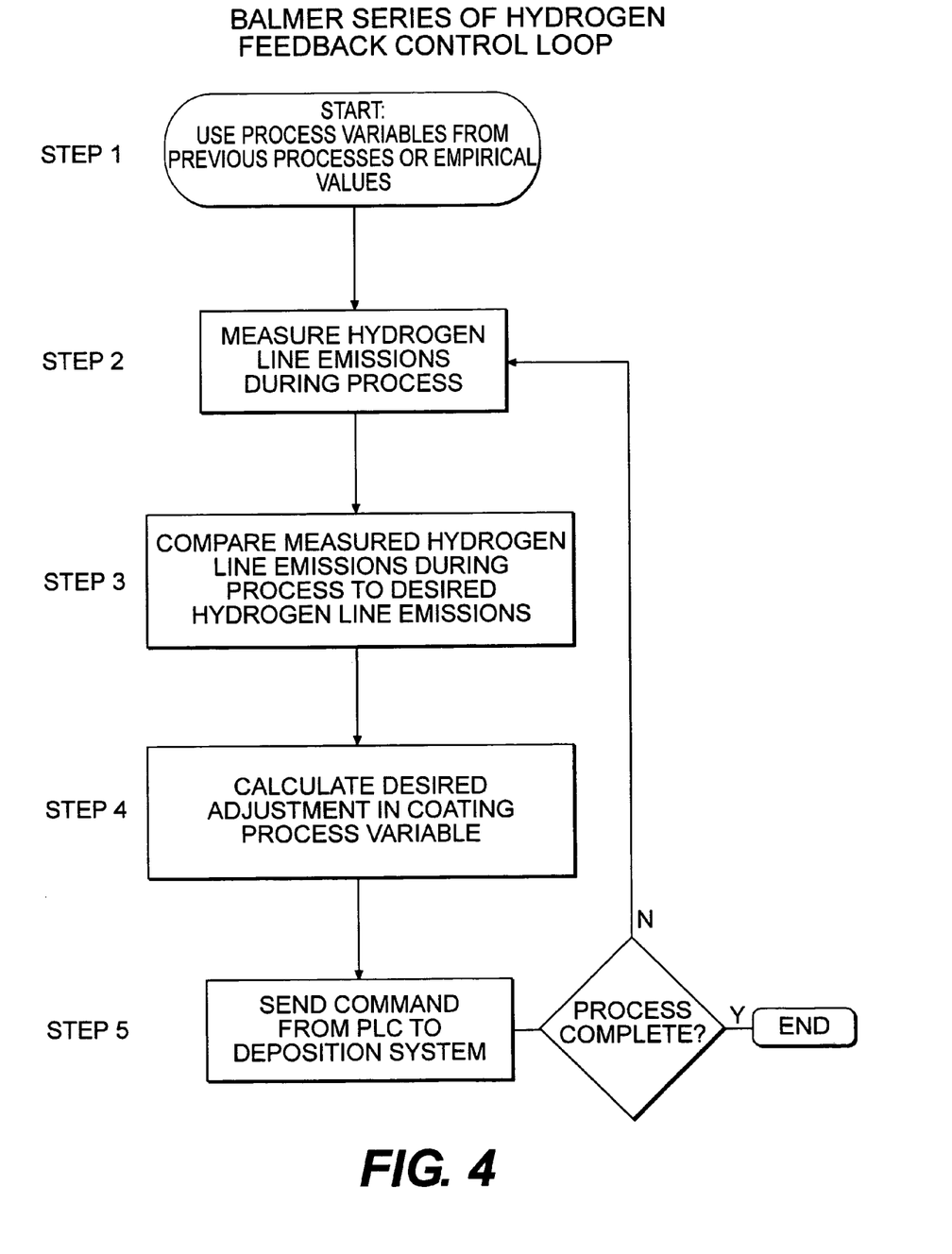
FIG. 4 is a flowchart of a method for controlling a coating deposition process, according to an exemplary disclosed embodiment.

As illustrated in FIG. 4, control system 18 may provide closed-loop feedback control of a coating production process based on hydrogn line emissions within deposition chamber 12. A coating production process may be initiated (Step 1) using a predefined set of production conditions. These conditions may be based on data collected from previous production processes or through empirically derived process conditions.

During coating production, hydrogen line emissions may be periodically or continuously measured by monochromator 16 (Step 2). Computers 34, 36 and/or PLC 40 may compare the measured hydrogen line emission intensity with a desired emission intensity (Step 3). The deviation of the measured hydrogen line emission intensity from the desired emission intensity may be used to determine a needed adjustment in one or more coating production process variables (Step 4). Finally, PLC 40 may effect the desired changes in coating production process variables (Step 5) through control of one or more components of deposition chamber 12. This process may be repeated until the coating production process is complete or until the process enters a stage in which hydrogen line emissions monitoring is not desired. It should be noted that the hydrogen line emissions which are monitored may include either $H_\alpha$ line emissions or $H_\beta$ line emissions. Further, in some embodiments, both $H_\alpha$ line emissions and $H_\beta$ line emissions may be monitored.

EXAMPLE

The following experiment was performed to demonstrate the feasibility of the use of $H_\alpha$ emission intensity monitoring as a closed-loop feedback control for DLC coating production. Although this process is described for the production of one coating type, the system may be used to produce a variety of different coatings having a range of compositions and structures. Further, numerous variations in the coating production process and deposition system may be made to facilitate production of a suitable coating.

Metal-containing DLC coatings were produced on both silicon and 52100 steel substrates using magnetron sputtering in the presence of a reactive background gas. Samples were produced using both open-loop and closed loop processes. The PVD system used to produce the coatings included deposition chamber 12 with magnetron sputtering system 20, as illustrated in FIG. 2. Sputtering system 20 included two planar cathodes 22, 24 on which chromium targets were mounted. Argon was the main working gas, and nitrogen and acetylene were introduced as reactive gases during the deposition sequence. The total gas pressure was maintained at about 6 mTorr, and all inner surfaces of deposition chamber 12 were radiatively heated to about 200 degrees Celsius.

A number of sensors were used to monitor the deposition process. Monochromator 16 had a line of sight as shown in FIG. 2 and was configured to monitor $H_\alpha$ emission within the plasma. In addition, a residual gas analyzer was provided to monitor levels of molecular gases within deposition chamber 12.

Figure 5:
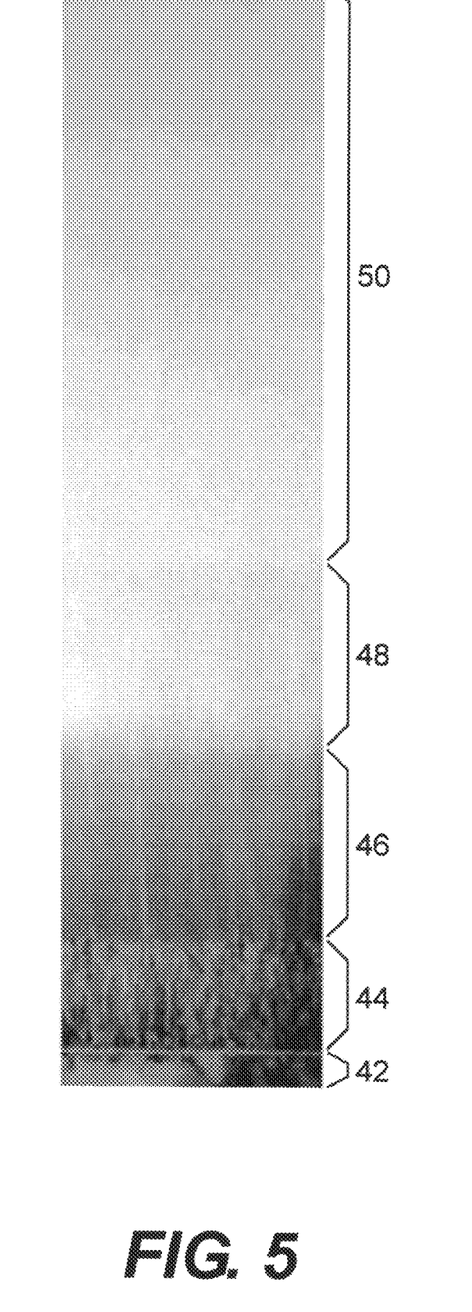
FIG. 5 illustrates a micrograph of a coating produced according to an exemplary disclosed embodiment.

Multi-layer coatings were produced with successive layers of chromium, chromium nitride, a mixture of chromium carbide and chromium nitride, DLC with chromium carbide nano-inclusions (DLC/chromium carbide), and amorphous hydrocarbon (aC:H). A sectional transmission electron micrograph (x-TEM) of one coating produced on a silicon substrate 42 using an open-loop process is illustrated in FIG. 5. The chromium layer 44 was formed by sputtering with no reactive gas in deposition chamber 12. The chromium nitride layer and mixture of chromium nitride and chromium carbide layer are seen as a single chromium nitride/chromium-carbide layer 46 in the micrograph. Chromium nitride/chromium-carbide layer 46 was formed by sputtering while feeding nitrogen and acetylene gases into deposition chamber 12, and the DLC/chromium-carbide layer 48 was formed by sputtering while feeding acetylene gases into deposition chamber 12. The amorphous hydrocarbon layer 50 formed late in deposition when the metal target became covered by carbon, hydrocarbon, or carbide species.

Compositional analysis was performed on each sample using a Scanning Auger Nanoprobe (Physical Electronics, U.S.A, Model Phi68). Carbon, chromium, oxygen, nitrogen, and nickel Auger signals were monitored for these experiments. Carbon Auger signals produced three distinct lineshapes (not shown). The first lineshape corresponds to surface carbon that is present on most materials exposed to atmosphere. The second lineshape corresponds to carbon bonded to chromium, forming a chrome-carbide species. The third lineshape represents a portion of the film including amorphous carbon-carbon configurations and carbon-chromium bonding that is carbide like. Analysis software was used to separate the carbon-carbon and carbide-like lineshapes using the first two lineshapes as basis functions.

Both open-loop and closed-loop deposition processes were performed. The open-loop process was performed first to produce a sample $H_\alpha$ emission intensity curve for the production of one type of coating. Next, additional samples were produced using $H_\alpha$ emission as a closed-loop control. The set-points for the closed-loop process were defined by the $H_\alpha$ emission intensity curve produced during the open-loop process. The gas flow rates for the closed-loop process were selected to mimic those used in the open-loop process (shown in FIG. 6), and $H_\alpha$ emission intensity was controlled by adjusting the sputtering system cathode power. The coating deposition process was initiated using a cathode voltage of about 450V.

Figure 6:
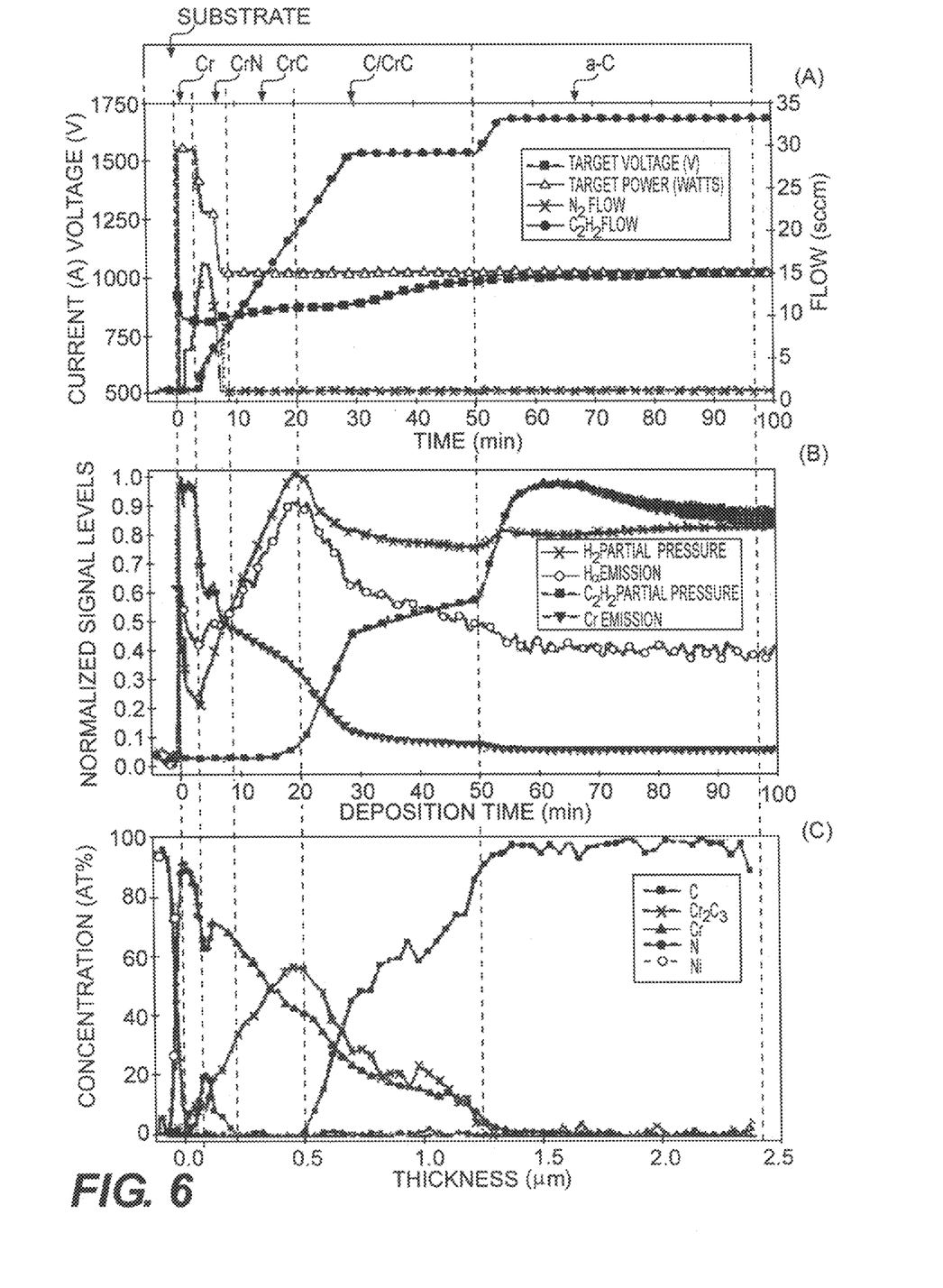
FIG. 6 illustrates the correlation between $H_\alpha$ emission intensity and the composition of one type of coating produced according to an exemplary disclosed embodiment.

FIG. 6 illustrates the correlation between $H_\alpha$ emission intensity, coating composition, gas flow rates, and partial pressures of hydrogen ($H_2$) and acetylene ($C_2H_2$) for one sample using an open-loop deposition process. The open loop process was selected to produce successive coating layers as described above.

Figure 7:
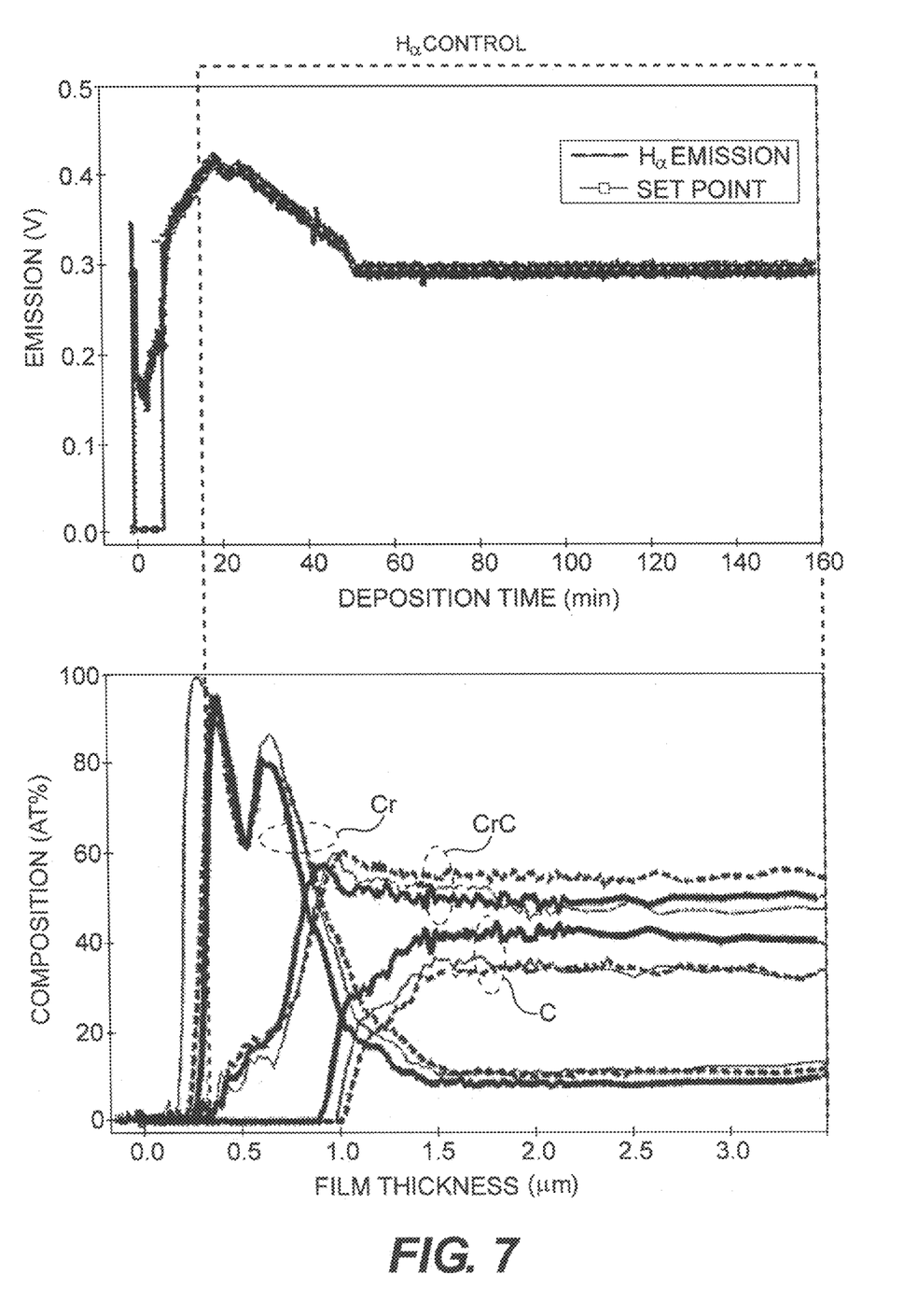
FIG. 7 illustrates the correlation between $H_\alpha$ emission intensity and the composition of one type of coating produced according to an exemplary disclosed embodiment.

The resulting composition profile for three samples produced by a closed-loop process is shown in FIG. 7. The $H_\alpha$ emission intensity for the closed-loop process closely follows the set-point curve produced by the open-loop process. Furthermore, all samples illustrated in FIG. 7 have similar compositions across their depths, as indicated by similar composition analysis curves for each sample. Therefore, $H_\alpha$ emission intensity measurement with closed-loop feedback control of cathode power may provide good sample reproducibility for production of Me-aC coatings. In addition, FIG. 7 demonstrates that DLC/chromium-carbide layers 48 may be produced at later times during the deposition process without production of the amorphous carbon layer 50. This may be due to a lower level of target poisoning during the closed-loop process.

It should be noted that the coating composition and structure may also be affected by a variety of other process variables. For example, the coating composition curves illustrated in FIG. 7 were produced using specific temperatures, gas flow rates, gas pressures, and/or target metals. Variations in these and other process conditions may be selected to produce suitable coatings using $H_\alpha$ emission feedback control. Therefore, although a specific coating composition may be produced using the data provided in FIGS. 6-7, various modifications in other process variables may be made to produce a suitable coating.

The experiments illustrated in FIG. 7 demonstrate that $H_\alpha$ emission intensity may be correlated with a number of coating features, including coating composition. For example, the coatings shown in FIG. 7 have a DLC/chromium-carbide layer 48 with between about 45 atomic % and 55 atomic % carbon in the form of chrome carbide, which corresponds to an $H_\alpha$ emission intensity of 0.3 V, using the reaction conditions and system described. FIG. 7 also demonstrates a variety of other compositions, which correspond to particular $H_\alpha$ emission intensities for given process conditions. Therefore, a desired coating composition may be produced by selection of appropriate reaction conditions and control of $H_\alpha$ emission intensity. Furthermore, although FIGS. 6 and 7 provide $H_\alpha$ emission intensity values for one deposition process, many suitable variations in other reaction conditions may be made, which may provide different $H_\alpha$ emission intensity values.

In addition, the $H_\alpha$ emission intensity may be selected to lie within a predetermined range, which may correspond to a certain coating composition. Again, the coatings shown in FIG. 7 have a DLC/chromium-carbide layer 48 with between about 45 atomic % and 55 atomic % carbon in the form of chrome carbide, which corresponds to an $H_\alpha$ emission intensity of 0.3 Volts (V), using the reaction conditions and system described. Alternatively, an $H_\alpha$ emission intensity may be selected to fall within a particular set-point range. For example, in this case, a range for the $H_\alpha$ emission intensity may be 0.3 V+/−0.02 V (0.28-0.32 V) for a concentration of carbon in the form of chrome carbide between about 45 atomic % and 55 atomic % at the specified deposition conditions.

Control system 18 may further be configured to determine if the $H_\alpha$ emissions intensity deviates from the desired range at any time during the production process. A substantial deviation of the $H_\alpha$ emission intensity from the desired intensity may indicate a variation in coating composition. Control system 18 may further be configured to pause the deposition process to correct the $H_\alpha$ emission intensity or to notify an operator of the deviation.

Furthermore, although the system and method of the present disclosure is particularly described for magnetron sputtering systems, $H_\alpha$ emission may be used to monitor and control the coating composition and structure within DLC coatings produced by a number of suitable methods. Further, feedback control may be effected through use of a variety of deposition system variables in addition to cathode power. Such variables may include, for example, temperature, pressure, gas flow rates, and/or any other suitable variable or combination of variables. Finally, although $H_\alpha$ emission monitoring was used to control coating production, it is contemplated the $H_\beta$ emission monitoring will also provide suitable control of coating production processes that include hydrogen line emission producing plasmas.

INDUSTRIAL APPLICABILITY

The present disclosure provides a system and method for producing nano-structured, metal-containing, diamond-like carbon coatings. The system may be used to produce coatings for use in any application in which diamond-like carbon may be used.

The method of the present disclosure includes monitoring the intensity of plasma hydrogen line emisssions during the coating production process. Plasma hydrogen line emission may be correlated with coating composition and structure, and a hydrogen line emission sensor may be used as a feedback control to facilitate monitoring and regulation of coating production, including regulation of metal-carbide formation. Control of coating production in this manner may provide better control of coating composition and structure, as compared to open-loop recipe managers. Further, the system of the present disclosure may provide improved batch-to-batch reproducibility and may provide a method for selecting a desired range of carbide concentrations and/or other coating components within sections of the coating.

The method of the present disclosure may further include the use of magnetron sputtering in the presence of a reactive background gas to produce a metal-containing, diamond-like carbon coating. The method may further include use of cathode power for feedback control of hydrogen line emission intensity and coating production. Cathode power control may provide reproducible control of coating production through all stages of coating deposition. Further, cathode power control may reduce or prevent coating variations due to aging of deposition system components, including wear of cathode targets.

In addition, hydrogen line emission monitoring may provide an accurate method for monitoring coating surface reactions by observing plasma characteristics. Particularly, changes in hydrogen line emissions in the deposition system plasma may be at least partially caused by the release of molecular hydrogen during the formation of particular coating species, including metal-carbides. The release of molecular hydrogen into the plasma may cause a change in plasma hydrogen line emission corresponding to relevant surface reactions, thereby providing a tool for monitoring the formation of certain coating species.

It will be apparent to those skilled in the art that various modifications and variations can be made in the disclosed systems and methods without departing from the scope of the disclosure. Other embodiments of the disclosed systems and methods will be apparent to those skilled in the art from consideration of the specification and practice of the embodiments disclosed herein. It is intended that the specification and examples be considered as exemplary only, with a true scope of the disclosure being indicated by the following claims and their equivalents.

What is claimed is:

1. A method for producing a coating, comprising:
   providing a substrate material;
   initiating a coating-deposition process to apply a coating material to the substrate material to produce a coating on the substrate material, wherein the coating includes a diamond-like carbon coating;
   selecting a desired intensity of hydrogen-alpha emission;

monitoring an intensity of hydrogen-alpha emission at the selected wavelength of a plasma produced during the coating-deposition process; and adjusting at least one process variable of the coating-deposition process to maintain the intensity of hydrogen-alpha emission of the plasma within a predetermined range of the selected intensity to facilitate production of the diamond like-carbon coating, the at least one process variable being selected from the group consisting of process temperature, reactive gas flow rates, process pressure, cathode power and combinations thereof.

2. The method of claim 1, wherein the coating includes a metal-containing amorphous carbon coating or a metal-containing amorphous hydrocarbon coating.

3. The method of claim 2, wherein the intensity of hydrogen-alpha emission corresponds to an amount of a metal-carbide in the coating.

4. The method of claim 2, wherein the coating includes at least one transition metal.

5. The method of claim 4, wherein the at least one transition metal is selected from the group including titanium, tungsten, zirconium, hafnium, niobium, molybdenum, and chromium.

6. The method of claim 1, wherein the coating-deposition process includes a physical vapor deposition process.

7. The method of claim 6, wherein the physical vapor deposition process includes a magnetron sputtering process.

8. The method of claim 7, wherein the at least one process variable includes the cathode power of the magnetron sputtering process.

9. The method of claim 1, wherein the at least one process variable includes varying a flow rate of a reactive gas to a coating deposition chamber.

10. The method of claim 9, wherein the reactive gas is selected from the group consisting of acetylene, nitrogen, fullerene, and benzene.

11. A method for producing a coating, comprising:
providing a substrate material;
initiating a coating-deposition process to apply a coating material to the substrate material to produce a coating on the substrate material, wherein the coating includes a diamond-like carbon coating;
selecting a desired intensity of hydrogen-alpha emission;
monitoring an intensity of hydrogen-beta emission of a plasma produced during the coating-deposition process; and
adjusting at least one process variable of the coating-deposition process to maintain the intensity of hydrogen-beta emission of the plasma within a predetermined range of the selected intensity to facilitate production of the diamond like-carbon coating, the at least one process variable being selected from the group consisting of process temperature, reactive gas flow rates, process pressure, cathode power and combinations thereof.

12. The method of claim 11, wherein the coating includes a metal-containing amorphous carbon coating or a metal-containing amorphous hydrocarbon coating.

13. The method of claim 12, wherein the selected intensity of hydrogen-beta emission corresponds to an amount of a metal-carbide in the coating.

14. A method for producing a coating, comprising:
providing a substrate material;
initiating a coating-deposition process to apply a metal-containing amorphous carbon coating or a metal-containing amorphous hydrocarbon coating to the substrate material that is also a diamond-like carbon coating;
selecting a desired intensity of hydrogen-alpha emission;
monitoring an intensity of hydrogen-alpha emission at the selected wavelength of a plasma produced during the coating-deposition process; and
adjusting the flow rates of acetylene and nitrogen during the coating-deposition process to maintain the intensity of hydrogen-alpha emission of the plasma within a predetermined range of the selected intensity to facilitate production of the metal-containing amorphous carbon coating or a metal-containing amorphous hydrocarbon diamond-like carbon coating.

15. The method of claim 14, wherein the selected intensity of hydrogen-alpha emission corresponds to an amount of a metal-carbide in the diamond-like carbon coating.

16. The method of claim 14, wherein the coating includes at least one transition metal.

17. The method of claim 16, wherein the at least one transition metal is selected from the group including titanium, tungsten, zirconium, hafnium, niobium, molybdenum, and chromium.

18. The method of claim 14, wherein the coating-deposition process includes a physical vapor deposition process.

19. The method of claim 18, wherein the physical vapor deposition process includes a magnetron sputtering process.

20. The method of claim 19, further comprising controlling a cathode power of the magnetron sputtering process to maintain the intensity of hydrogen-alpha emission within the predetermined range.

* * * * *